US008012535B2

(12) United States Patent
Sottke et al.

(10) Patent No.: US 8,012,535 B2
(45) Date of Patent: Sep. 6, 2011

(54) METHOD FOR PRODUCING A COATED SUBSTRATE BODY, SUBSTRATE BODY COMPRISING A COATING AND USE OF THE COATED SUBSTRATE BODY

(75) Inventors: Volkmar Sottke, Mülheim/Ruhr (DE); Doris Lenk, Mülheim/Ruhr (DE); Hartmut Westphal, Dermbach/Rhön (DE); Hendrikus Van Den Berg, Venlo-Blerick (NL)

(73) Assignee: Kennametal Widia Produktions GmbH & Co KG, Essen (DE)

( * ) Notice: Subject to any disclaimer, the term of this patent is extended or adjusted under 35 U.S.C. 154(b) by 691 days.

(21) Appl. No.: 12/067,897

(22) PCT Filed: Oct. 7, 2006

(86) PCT No.: PCT/DE2006/001755
§ 371 (c)(1),
(2), (4) Date: Mar. 24, 2008

(87) PCT Pub. No.: WO2007/045209
PCT Pub. Date: Apr. 26, 2007

(65) Prior Publication Data
US 2009/0042059 A1 Feb. 12, 2009

(30) Foreign Application Priority Data
Oct. 15, 2005 (DE) .......... 10 2005 049 393

(51) Int. Cl.
*C23C 16/36* (2006.01)

(52) U.S. Cl. ........... 427/249.1; 427/249.17; 427/249.18; 427/249.19; 427/255.391; 427/255.394

(58) Field of Classification Search ............... 427/249.1, 427/249.17, 249.18, 249.19, 255.391, 255.394
See application file for complete search history.

(56) References Cited

U.S. PATENT DOCUMENTS

| 3,771,976 A | * | 11/1973 | Wakefield ..................... 428/457 |
| 3,897,417 A | | 7/1975 | Warnant |
| 3,919,198 A | | 11/1975 | Warnant |
| 4,016,013 A | * | 4/1977 | Bitzer et al. .................. 148/218 |
| 4,196,233 A | * | 4/1980 | Bitzer et al. ............... 427/249.1 |
| 5,223,945 A | | 6/1993 | Honda .......................... 358/335 |
| 5,436,071 A | * | 7/1995 | Odani et al. .................. 428/336 |
| 6,472,060 B1 | | 10/2002 | Ruppi ........................... 428/325 |
| 6,620,498 B2 | | 9/2003 | Ruppi ........................... 428/325 |
| 7,192,660 B2 | | 3/2007 | Ruppi ........................... 428/698 |
| 2007/0190250 A1 | | 8/2007 | Ruppi ................... 427/255.391 |

FOREIGN PATENT DOCUMENTS
DE 279603 6/1990
* cited by examiner

*Primary Examiner* — Bret Chen
(74) *Attorney, Agent, or Firm* — Matthew W. Gordon

(57) ABSTRACT

The invention relates to a method for producing a coated substrate body by chemical vapor deposition at least on one layer made of a carbonitride of a metal of IVa-VIa-groups of the periodic table, wherein a monocyclic hydrocarbon is used in the gas atmosphere during the deposition, in addition to a nitrile. According to the invention, the thus produced coated substrate body has a high degree of hardness and is used, preferably, in cutting operations where the cutting speeds are ≧250 m/min.

15 Claims, 2 Drawing Sheets

Figure 1A:
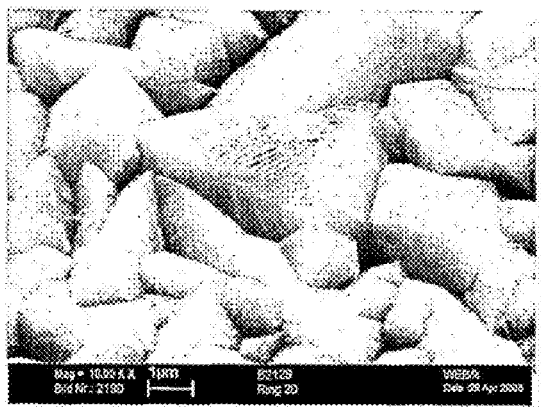

METHOD FOR PRODUCING A COATED SUBSTRATE BODY, SUBSTRATE BODY COMPRISING A COATING AND USE OF THE COATED SUBSTRATE BODY

CROSS REFERENCE TO RELATED APPLICATIONS

This application is the US national phase of PCT application PCT/DE2006/001755, filed 7 Oct. 2006, published 26 Apr. 2007 as WO 2007/045209, and claiming the priority of German patent application 102005049393.9 itself filed 15 Oct. 2005, whose entire disclosures are herewith incorporated by reference.

The invention relates to a method for producing a coated substrate body by CVD deposition of at least one layer composed of a carbon nitride of a metal from the IVa-VIa group of the periodic table.

The invention further relates to a coated substrate body and its use.

Coatings of hard material have been known for quite some time that serve to enhance the wear resistance of a body at the surface. In particular, with substrate bodies used as cutting tools, a single-layer or multi-layer surface coating has been used successfully for many years. The best-known wear-resisting coatings include TiCN and TiC.

An approach is described in DE 25 05 007 [U.S. Pat. Nos. 3,919,198 and 3,897,417] whereby inorganic substrates can be deposited that include carbides, nitrides, and/or carbon nitrides of iron, boron, silicon, or the transition metals of the IVa-VIa group of the periodic table, or derivatives thereof, with organic substances supplying carbon or nitrogen, optionally in the presence of other additives. A number of materials, including cyanoalkyl, among others, are mentioned as the organic suppliers of carbon and nitrogen. Derivatives of the mentioned metals are accordingly used in the form of hydrides, carbonyls, carbonyl hydrides, metaloorganic compounds, and halides. The chemical vapor deposition (CVD) accordingly takes place between 500° C. and 800° C.

Among others, DE 25 05 008 [U.S. Pat. No. 4,016,013] additionally mentions an approach whereby diffusion layers composed of carbides, nitrides, and/or carbon nitrides are produced according to this method.

In addition, an approach is known in the art whereby the CVD process is preferably run at temperatures between 800° C. and 1,000° C. This so-called medium-temperature CVD process has the advantage that the substrate material is no longer exposed to high temperatures during the coating process, as was normally the case previously, at which to some extent undesirable microstructural changes in the substrate body occur. EP 0 440 167 [U.S. Pat. No. 5,223,945] is mentioned as an example wherein a method is described in which at least one titanium carbonitride is accordingly deposited on a cermet substrate body by CVD at temperatures between 700° C. and 900° C., where in the CVD process used a acetonitrile-containing reaction gas is accordingly employed in addition to titanium tetrachloride and hydrogen. When TiCN coatings are deposited using the medium-temperature process, what is obtained is a coating with a textured, laminar-like structure that has a high resistance to wear.

Medium-temperature CVD processes are also mentioned in documents US 2002/0012818 [U.S. Pat. No. 6,620,498], U.S. Pat. No. 6,472,060 B1, EP 1 471 166 A2 [U.S. Pat. No. 7,192,660], and EP 1 471 165 A2 [US 2004/0026554 2007/00190250]. In these documents, CO and $CO_2$, among others, are employed in the gas phase as doping agents by which the goal is essentially a refinement of grain.

In the prior art, TiC is usually deposited by CVD using $CH_4$. DD 276 603 A3 proposes using a gas mixture containing $C_6H_6$ to deposit TiC. Benzene can also be used in combination with nitrogen or nitrogen derivatives to deposit TiCN.

Investigations of TiCN and ZrCN coating layers have shown that these layers which have a defined structure have better wear-resistance properties than nontextured layers. The texturing of the deposited carbon nitride layer can be controlled through the selection of co-reactants in the gas phase.

The document "Mat.-wiss. u. Werkstofftech. 25, 79-85 (1994)" describes the effect of various hydrocarbons on the preparation, structure, and wear resistance of CVD-$TiC_x$ hard-material coating layers with the result that the microstructure and structure of a hard material coating layer strongly determines its mechanical stability hardness or resistance to wear. Relatively coarse-grained $TiC_x$ coating layers that are produced using n-heptane in the gas phase exhibit a relatively pronounced coarse-grained columnar microstructure along with an increased susceptibility to cracking. On the other hand, $TiC_x$ coating layers produced with benzene exhibit a fine-crystalline granular microstructure with high mechanical stability.

For machining cast iron, substrate bodies with TiCN coating layers are preferably employed that have a high C content. When the objective is to utilize substrate bodies coated with TiCN for machining steel, according to prior art a TiCN with an increased nitrogen content is selected.

In the known CVD process, the C/N ratio in TiCN coating layers can be controlled in the gas phase by varying the quantities of the gas $N_2$ (as the single nitrogen donor) and $CH_4$ (as the single carbon donor), however, what is obtained is a TiCN coating layer with isotropic properties that has inferior wear resistance than do TiCN coating layers with anisotropic properties.

Starting with the above-described prior art, the object of the invention is to provide a method by which a coating layer or coating layer system with high resistance to wear can be produced. A further object of the invention is to provide a corresponding coated substrate body, as well as its application.

The object mentioned first is achieved by a method according to claim 1. Developments of this method are described in claims 2 through 15. According to the invention, in addition to an organic nitrogen carrier, preferably a nitrile, used in the gas atmosphere during CVD deposition, another organic carbon carrier, preferably a monocyclic hydrocarbon, is employed.

The use of specific mixture ratios of the organic carbon-nitrogen carriers—specifically, e.g. a nitrile, in particular, acetonitrile or an amine, e.g. ethyl amine and/or dimethyl amine or nitrogen-containing heterocyclic hydrocarbons, e.g. pyridines or pyrimidines or triazoles, as the nitrogen donor, and a monocyclic hydrocarbon, e.g. benzene, toluene, cyclohexane, styrene as the carbon donor, enables the C/N ratio in the carbon nitride coating layer to be adjusted (shifting) in a precise manner, where the deposited coating layer is anisotropic, i.e. textured.

The substrate body produced by this method in particular has a microhardness HV 0.05 of $\geq 2{,}500$.

Preferred areas of application according to the invention are machining, in particular, the turning, milling, or drilling at high cutting speeds greater than 250 m/min.

In particular, the nitrile used in the gas phase is acetonitrile. What are preferred in particular as monocyclic hydrocarbons are benzene or cyclohexane, however, toluene, xylene, styrene, and/or mixtures of the above-described monocyclic hydrocarbons can also be used.

In another embodiment of the invention, free nitrogen in the form of $N_2$ gas and/or carbon monoxide CO gas and/or $NH_3$ is also added to the organic nitrogen carrier and the monocyclic hydrocarbon. These additives enable the grain size to be further refined, and the textures and C/N ratio in the TiCN coating layer to be modified.

The coating is preferably applied at temperatures of between 880° C. and 970° C., in particular 940° C. and 970° C. In another embodiment of the invention, the selected pressure of the gas atmosphere during the coating process is between 5 kPa and 50 kPa, preferably, 10 kPa.

The substrate body can be composed of a metal, cermet, hard metal, ceramic, or cubic boron nitride (CBN) and steel.

Within the scope of the invention, it is possible for the deposited coating layer to be a single layer on the substrate body, the top layer of multiple layers, or an intermediate layer, in particular, a diffusion barrier. In the case of multiple deposited layers, the individual layers can have the same or different compositions and/or structures.

The thickness of a single layer, or of one of multiple deposited layers, preferably ranges between 0.1 µm and 15 µm. The overall thickness of a multilayer coating according to the invention is maximum of 25 µm, in particular, a maximum of 10 µm.

The deposited layer, or deposited layers are preferably composed of a carbon nitride of titanium, zirconium, hafnium, vanadium, or chromium, or of crystalline mixtures thereof.

In order to increase hardness, the selected ratio of nitrile (AN) to monocyclic hydrocarbon (BZ) is between 1:0 and 1:1, preferably, between 2:1 and 1:16, and in particular, between 1:3 and 1:10 in the gas phase during the coating process.

The substrate body produced based on the foregoing process features preferably has according to the invention a coating with a microhardness HV 0.05 of $\geq 2,500$.

As will be shown, the cutting insert is particularly suitable for machining work at high cutting speeds.

The coated substrate body according to this invention can also be used as a wear-resistance constructive component, wherein the wear-resistant coating can also be combined with additional known wear-resistant coatings of prior art.

If the objective is to optimize the residual stress of the wear-resistant coatings and/or the surface quality, the coated body can undergo a secondary treatment, in particular, by abrasive blasting or brush plating.

Figure 1B:
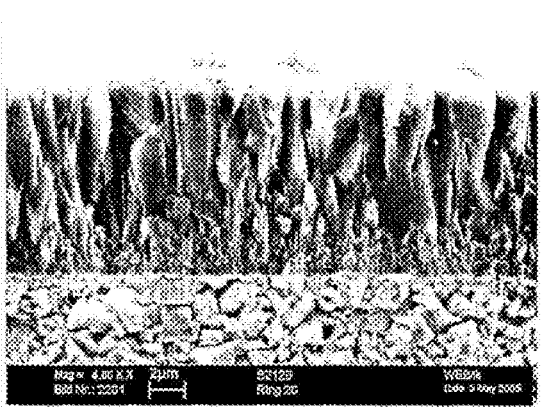
Figure 2A:
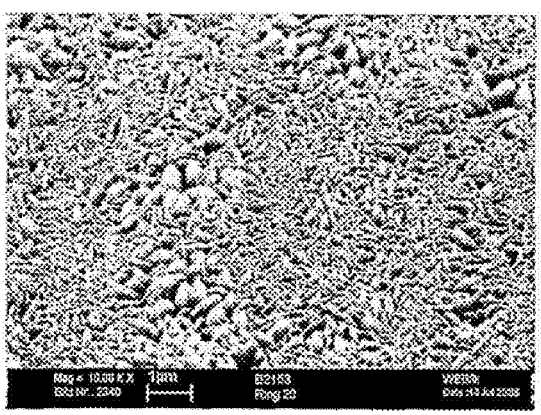
Figure 2B:
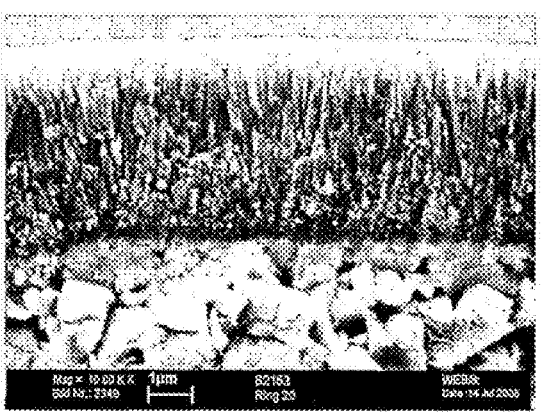
Figure 3A:
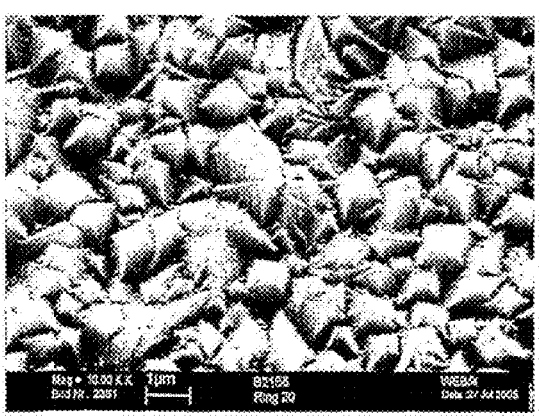
Figure 3B:
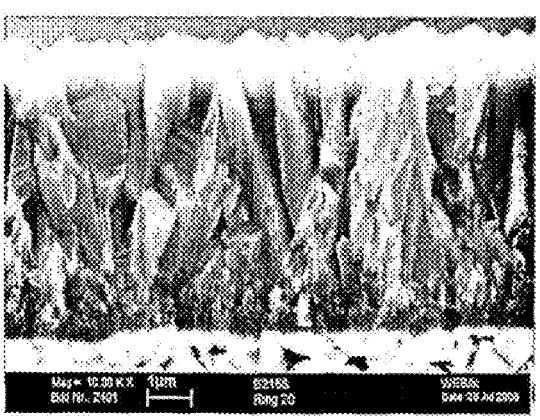
Figure 4:
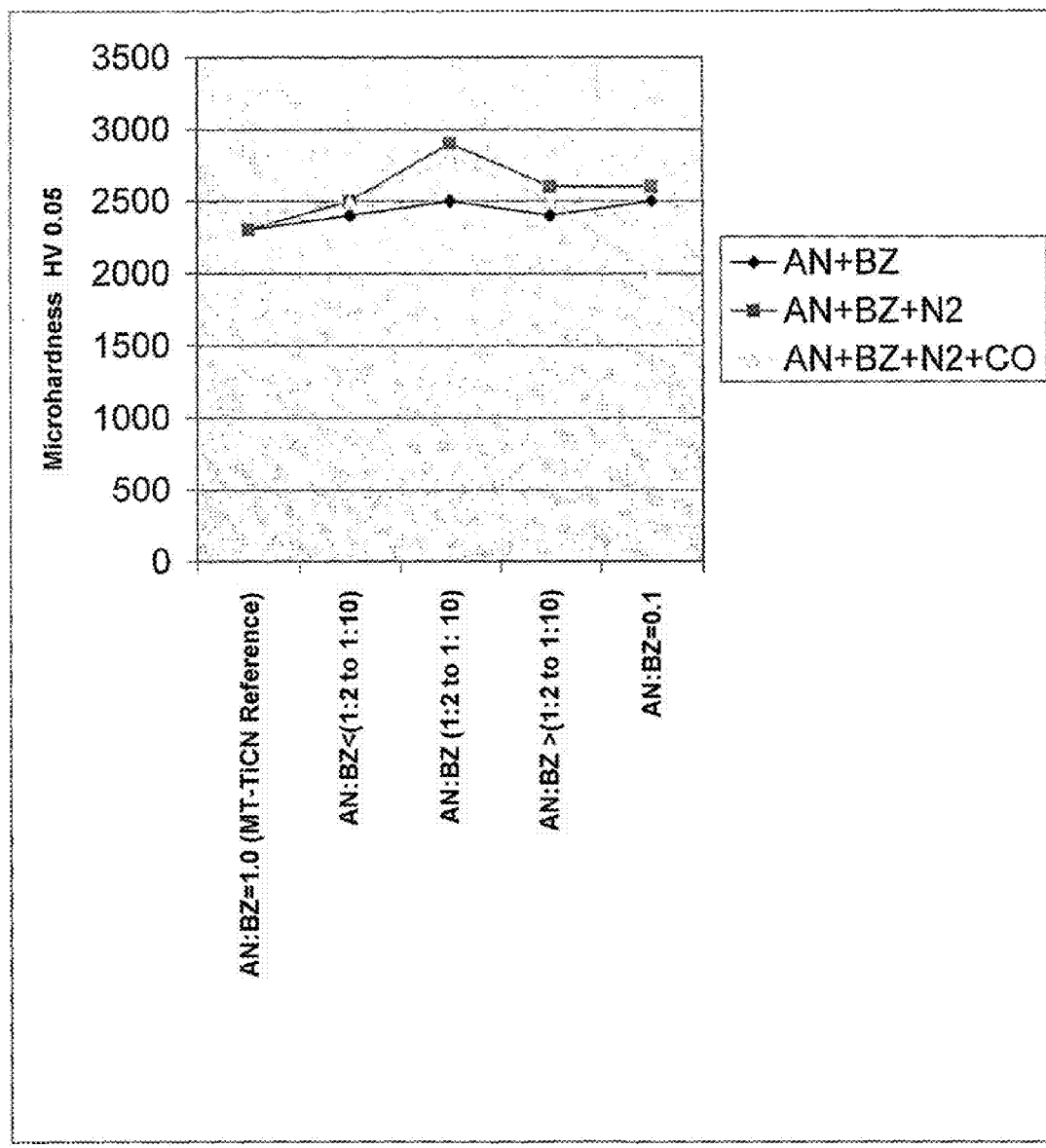

Additional advantages and embodiments of the inventions are explained below and described based on the drawings. These are:

FIGS. 1a, 2a, and 3a are top views of TiCN grain structures that were obtained in various tests;

FIGS. 1b, 2b, and 3b show SEM micrographs of corresponding grain structures; and FIG. 4 is a graph illustrating the hardness curve for various TiCN variants as a function of the percentage of benzene in an acetonitrile/benzene mixture.

In a concrete embodiment, a substrate body was employed that was composed of a hard metal with the composition: 85.3% by weight WC, 2.7% by weight mixed carbides (i.e. tantalum, titanium, and niobium carbides) and 12% by weight cobalt. This body was treated by a CVD process in a coating reactor at temperatures between 940° C. and 970° C., and a pressure of 8 kPa (80 mbar) during which the ratio of acetonitrile (AN) to benzene (BZ) was varied in different test series between 1:0 and 0:1. In addition to the mentioned organic substances, both $TiCl_4$ and the carrier gas $H_2$ were present in the gas atmosphere.

During a second test series performed otherwise under the same experimental conditions, pure nitrogen was also added to the gas mixture of acetonitrile and benzene, while in another test series nitrogen and carbon monoxide were added to this mixture. The gas percentage for $TiCl_4$ was 2.3% by volume, whereas the benzene percentage was varied between 0.4% and 2.2% by volume, and the percentage of acetonitrile was varied between 0.14% and 0.7% by volume in the first test series, and the remainder being $H_2$.

In the third test series, 20% by volume of nitrogen gas was added, while in a fourth test series 1% by volume of carbon monoxide was added (in each case at the expense of the residual proportion of hydrogen).

Comparative investigations have demonstrated that grain size becomes smaller with an increasing proportion of benzene (as compared with pure acetonitrile), where the typically coarse laminar-like structure of the applied TiCN changes, and with the increasing proportion of benzene changes to ever finer columnar to lamellar TiCN crystal forms. A comparison of the SEM micrographs of FIGS. 1a, b with FIGS. 2a, b shows the microstructural change. While in the first case at identical temperatures and pressures only acetonitrile and no benzene was present in the gas mixture, during the coating process in FIGS. 2a, b the proportion of benzene predominated.

Due to the addition of nitrogen to the gas mixture in the presence of a small percentage of benzene and larger percentage of acetonitrile (see SEM micrographs of FIGS. 3a and b), the grain structure was finer that for the TiCN coatings that are applied without the proportions of benzene and nitrogen: the addition of nitrogen produces only a laminar-like grain structure. When carbon monoxide is also added, the result is a further refinement of the grain with grain structures $\leq 0.1$ µm.

If in the gas phase only acetonitrile is used in addition to the carrier gas $H_2$ and $TiCl_4$, what is obtained in the deposited TiCN is a <220> texture and combinations of <220> and <331>. Nothing changes here as well when nitrogen, or nitrogen with oxygen, are present in the gas atmosphere during CVD deposition. As the proportion of benzene increases in the gas mixture, however, what results is a change in texture in which predominantly <331> textures, but also combinations of <221> and <220> textures are measured. Given a low percentage of benzene, combinations of <442> and <331> textures were obtained in this test series.

As is expected due to the greater proportion of carbon, the lattice constant of the deposited TiCN becomes larger as the proportion of benzene increases. By adding more nitrogen ($N_2$) in the gas mixture and/or adding more CO, additional controls on the lattice constant of the deposited TiCN can be effected.

The decisive aspect, however, is that the hardness of the deposited TiCN layer can be significantly enhanced—as the graph of FIG. 4 demonstrates. In the case TiCN depositions in which benzene was used in addition to acetonitrile, a significant increase in hardness was able to be achieved, where the hardness curve passes through a maximum that is approximately in the zone in which the ratio of acetonitrile to benzene ranges between 1:3 and 1:10. In this zone, it was possible to achieve a further increase in hardness by the addition of nitrogen and carbon, the greatest hardness being obtained when acetonitrile, benzene, and nitrogen gas are present in the atmosphere in addition to the metal chloride and hydrogen.

In the wear tests, in each case cutting bodies with a geometry XPHT 160 412 were studied on which the coatings according to the invention have been applied. The layer structure was consistently composed of a hard metal substrate body of the previously indicated composition and a layer sequence TiN—TiCN—Al$_2$O$_3$. All coatings were applied using the so-called medium-temperature CVD process. What is mentioned in Table 1 in terms of MT-CVD is a comparison cutting body in which exclusively acetonitrile, titanium tetrachloride and hydrogen were used as the carrier gas. This compares cutting bodies that although otherwise having the same compositions have a TiCN layer which has been deposited in a gas atmosphere that has low, medium, and high proportions of benzene. Tool steels of the composition 42CrMoV were treated with a shoulder-type face mill at various cutting speeds, where aside from the varying cutting speeds a cutting depth of $a_p$=2 mm and a tooth feed of $f_z$=0.25 mm/rev were the selected parameters. As is seen in Table 1, the cutting times relative to the reference sample (MT-CVD) were able to be increased in all test series, where the maximum cutting times were achieved at an AN:BZ ratio ranging from 1:1 to 1:10, and cutting speeds of 250 m/min.

TABLE 1

Results of the machining tests

| | Cutting speed m/min | MT-CVD Cutting time min | AN:BZ < (1:2 to 1:10) Cutting time min | AN:BZ (1:2 to 1:10) Cutting time min | AN:BZ > (1:2 to 1:10) Cutting time min |
|---|---|---|---|---|---|
| TiCl$_4$ | 250 | 38* | 40 | 62 | 52 |
| | 250 | 22* | 19 | 27 | 24 |
| | 315 | 14* | 15 | 18 | 17 |
| TiCl$_4$ + N$_2$ | 250 | | 40 | 66 | 52 |
| | 280 | | 25 | 51 | 39 |
| | 315 | | 16 | 28 | 20 |
| TiCl$_4$ + N$_2$ + CO | 258 | | | 55 | |
| | 280 | | | 40 | |
| | 315 | | | 20 | |

*reference sample (MT-CVD)

The invention claimed is:

1. A method for producing in a gas atmosphere a coated substrate body by CVD Deposition of at least one layer composed of a carbon nitride of a metal from Groups IVa through VIa of the periodic table, the method comprising the step of providing at least one organic nitrogen carrier selected from the group consisting of a nitrile, an amine, a heterocyclic hydrocarbon containing a nitrogen heterocyclic atom, and mixtures thereof and at least one monocyclic hydrocarbon as an organic carbon carrier in the gas atmosphere, wherein the ratio of the organic nitrogen carrier to the organic carbon carrier is 1:2 to 1:10.

2. The method according to claim 1 wherein the organic nitrogen carrier is a nitrile.

3. The method according to claim 1, wherein the organic nitrogen carrier consists of ethylamine as the amine.

4. The method according to claim 1 wherein the organic nitrogen carrier consists of pyrimidine, pyridine or triazole as the heterocyclic hydrocarbon containing a heterocyclic nitrogen atom.

5. The method according to claim 1, wherein the monocyclic hydrocarbon carbon carrier is composed of benzene, toluene, xylene, styrene, and/or cyclohexane, or mixtures thereof.

6. The method according to claim 1 wherein free nitrogen (N$_2$) or carbon monoxide (CO) or NH$_3$ are introduced into the gas atmosphere in addition during the coating process.

7. The method according to claim 1 wherein the coating is applied at temperatures between 880° C. and 970° C.

8. The method according to claim 1 wherein the pressure of the gas atmosphere during the coating process is between 5 kPa and 50 kPa.

9. The method according to claim 1, wherein the substrate body is composed of metal, a cermet, a hard metal, a ceramic, a cubic boron nitride (CBN) or high-speed steel.

10. The method according to claim 1 wherein the deposited layer is the only layer on the substrate body, the top layer of multiple layers, or an intermediate layer, or that a plurality of layers of identical or different compositions or structures is deposited.

11. The method according to claim 10, wherein the single layer, or one of multiple deposited layers, has a thickness ranging from 0.1 μm to 15 μm.

12. The method according to claim 11 wherein the overall thickness of a multilayer coating is ≦25 μm.

13. The method according to claim 1 wherein the at least one deposited layer is composed of a carbon nitride of Ti, Zr, Hf, V, or Cr, or a crystal mixture thereof.

14. The method according to claim 2 wherein the nitrile is acetonitrile.

15. The method according to claim 1 wherein the nitrile organic nitrogen carrier is acetonitrile and the carbocyclic carbon carrier is benzene.

* * * * *